US009240793B2

(12) United States Patent
Malpass (10) Patent No.: US 9,240,793 B2
(45) Date of Patent: Jan. 19, 2016

(54) METHOD FOR PROVIDING A STABILIZED OSCILLATOR SIGNAL

(71) Applicant: Dialog Semiconductor GmbH, Kirchheim/Teck-Nabern (DE)

(72) Inventor: Adam Malpass, Tokyo (JP)

(73) Assignee: Dialog Semiconductor GmbH, Kirchheim/Teck-Nabern (DE)

(*) Notice: Subject to any disclaimer, the term of this patent is extended or adjusted under 35 U.S.C. 154(b) by 0 days.

(21) Appl. No.: 14/247,644

(22) Filed: Apr. 8, 2014

(65) Prior Publication Data

US 2014/0306771 A1 Oct. 16, 2014

Related U.S. Application Data

(60) Provisional application No. 61/811,231, filed on Apr. 12, 2013.

(51) Int. Cl.
*H03K 3/03* (2006.01)
*H03L 7/00* (2006.01)
*H03B 5/30* (2006.01)
*H03B 5/36* (2006.01)
*H03L 7/24* (2006.01)
*H03L 1/02* (2006.01)

(52) U.S. Cl.
CPC .. *H03L 7/00* (2013.01); *H03B 5/30* (2013.01); *H03B 5/36* (2013.01); *H03K 3/03* (2013.01); *H03L 1/022* (2013.01); *H03L 1/027* (2013.01); *H03L 7/24* (2013.01)

(58) Field of Classification Search
CPC .............. H03B 5/36; H03B 5/30; H03K 3/03; H03L 7/24
USPC ................ 331/158, 176, 2, 74, 44, 46, 47, 48
See application file for complete search history.

(56) References Cited

U.S. PATENT DOCUMENTS

| | | | |
|---|---|---|---|
| 6,831,525 B1 * | 12/2004 | Beaudin et al. ............... | 331/176 |
| 7,545,228 B1 | 6/2009 | Lu et al. | |
| 2005/0012561 A1 | 1/2005 | Young et al. | |
| 2007/0035353 A1 | 2/2007 | Chapin et al. | |
| 2007/0247245 A1 | 10/2007 | Hagelin | |

OTHER PUBLICATIONS

European Search Report 14157048.1-1805 Mailed: Aug. 8, 2014, Dialog Semiconductor GmbH.

* cited by examiner

*Primary Examiner* — Arnold Kinkead
(74) *Attorney, Agent, or Firm* — Saile Ackerman LLC; Stephen B. Ackerman (57) ABSTRACT

A method for stabilizing the output frequency of an oscillator comprises providing a temperature model to capture the temperature characteristics of a second oscillator when measured by a first oscillator, measuring a value indicative of the frequency of the second oscillator by using the first oscillator, determine a temperature of the second oscillator based on the measured value indicative of the frequency of the second oscillator and the temperature model, determining a compensation amount for the frequency of the first oscillator from the determined temperature, and providing a compensated output frequency of the first oscillator as a stabilized output.

19 Claims, 4 Drawing Sheets

METHOD FOR PROVIDING A STABILIZED OSCILLATOR SIGNAL

TECHNICAL FIELD

The present document relates to providing a stabilized output of oscillators. In particular, the present document relates to (MEMs).

BACKGROUND

The application relates to a method and a device for providing a stabilized output frequency of an oscillator. In general, electronic components such as resonator circuits or microelectromechanical systems (MEMs) show a temperature dependent oscillation behavior. If a stable frequency output of an oscillator is desired, any temperature dependency of electronic components may lead to unwanted effects. Thus, it is desirable to provide a stabilized oscillator signal, wherein a temperature dependency of the oscillation frequency is compensated in real time.

Further, temperature measurements on ICs, system in packages and multi-chip modules, etc., are typically done with a temperature sensitive component or structure like a diode or band gap reference. One problem with these is they may have large and variable second and higher order temperature coefficients. This requires a time-consuming calibration procedure to correct if high accuracies at high and low temperatures are required. Another issue is that the transient thermal response of these integrated sensors to a step change in temperature may not match the transient response of the chip area, component or other temperature sensitive element such as a resonator circuit. This can cause problems due to the mismatch in actual and recorded temperatures, if for example real-time temperature information is required for improved circuit operation, e.g. if a temperature measurement is used as part of a feedback circuit. Thus, it is further desirable to provide a method and a device for fast and accurate temperature measurements during operation of the device.

SUMMARY

Embodiments of the present invention provide a method for stabilizing the output frequency of an oscillator. A temperature model may be provided to capture the temperature characteristics of a second oscillator when measured by a first oscillator. The temperature model may be pre-calculated and stored on an electronic device comprising the first and second oscillator. The method comprises measuring a value indicative of the frequency of the second oscillator by using the first oscillator. The measured value does not necessarily correspond to the actual frequency of the second oscillator, but may be influenced by temperature-dependent effects of the frequency of the first oscillator, which is used as a reference clock signal. Based on the measured value indicative of the frequency of the second oscillator and the temperature model, a temperature of the second oscillator is determined. The method further comprises compensating the frequency of the first oscillator based on the determined temperature. For the temperature compensation, a compensation amount for the frequency of the first oscillator may be determined from the determined temperature. The compensated output frequency of the first oscillator is then provided as a stabilized output. In the simplest form, the compensation account is an offset for the determined temperature, the offset being added to the frequency of the first oscillator to provide the output frequency of the first oscillator. The compensation may also comprise a multiplication of the measured frequency of the first oscillator with a compensation factor, specific for the determined temperature. Temperature dependent offsets and compensation factors may e.g. be stored in a memory of the electronic device and accessed based on the determined temperature of the device. Other compensation methods to correct the frequency of the first oscillator depending on the temperature are possible, too.

Thus, the method enables the determination of the temperature of a device from the temperature-dependent behavior of two oscillators in the device, wherein the determined temperature can then be used in order to provide a stabilized frequency output. The method uses the temperature characteristics of the oscillators' respective frequencies in order to measure the temperature in real time, such that even large or abrupt changes in temperature can be detected and compensated efficiently. Therein, the first oscillator may have the same temperature as the second oscillator.

According to embodiments, a correction model describing the compensation amount for frequencies of the first oscillator depending on its temperature may be provided. The correction model may be pre-calculated and stored on the electronic device. The correction model may capture a temperature characteristic for the first oscillator which describes the dependency of the first oscillator's frequency on the temperature. The correction model, which may be provided e.g. as a look-up table or as an analytic function using determined parameters, allows the compensation amount to be determined in a fast and efficient manner, so that the output frequency can be stabilized even during rapid temperature changes.

According to embodiments, the step of measuring a value indicative of the frequency of the second oscillator by using the first oscillator may include measuring the frequency of the second oscillator, using the first oscillator as a frequency reference. The temperature of the second oscillator is then determined from the measured frequency. Therein, the measured frequency does not necessarily correspond to the actual frequency of the second oscillator, but may be shifted according to temperature-dependent effects of the reference oscillator. The frequency dependence of the clock (first oscillator) is taken care of in the temperature model.

The temperature model may be based on the temperature characteristics of the first and the second oscillator, wherein the model input corresponds to a frequency measurement of the second oscillator, using the first oscillator as a frequency reference, and the model output corresponds to a temperature. Thus, the temperature model allows a determination of the temperature in the vicinity of the first and second oscillator from a frequency measurement. As frequencies can be measured in a fast and efficient manner, the temperature model allows a fast and accurate temperature measurement.

According to embodiments, the step of measuring a value indicative of the frequency of the second oscillator by using the first oscillator may comprise providing a reference signal by scaling the output of the first oscillator (e.g. by using a divider) and mapping the output of the second oscillator onto the reference signal. Thus, two frequency values which are possibly very close to each other can be compared to each other without the need for a large integration time.

According to embodiments, measuring a value indicative of the frequency of the second oscillator by using a first oscillator may comprise measuring a difference between the respective frequencies of first and the second oscillator. The temperature may then be determined from the measured difference.

According to embodiments, measuring a value indicative of the frequency of the second oscillator by using a first oscillator may comprise counting the respective number of oscillations in the output of the first and the second oscillator, setting a flag when the faster oscillator reaches a predetermined target value of oscillations and counting the oscillations of the slower oscillator until it also reaches the target value of oscillations. The temperature may then be determined from the number of counts between the setting of the flag and the slower oscillator reaching the target value. Thus, value indicative of the frequency difference can be determined in a fast and efficient manner.

In embodiments, the frequencies of the first and second oscillator are divided by programmable dividers. The division values may be determined from measured values of first and second frequencies at known temperatures, e.g. determined during calibration. The divided frequencies may then be combined to generate the compensated output frequency. The combination may be an addition or a subtraction of the frequencies. Preferably, the division values for the programmable dividers are determined such that the combined frequency is at a desired target frequency.

In embodiments, the combined frequency is fed back to one of the programmable dividers for further temperature compensation. Thus, the division ratio applied by one of the dividers depends on the combined frequency, possibly via a look up table. This feedback loop regulates the division ratio based on the combined frequency, thereby flattening the temperature characteristics of the combined frequency.

In embodiments, the temperature characteristic of the first oscillator may differ from the temperature characteristic of the second oscillator. This allows the difference between the frequencies of the first and the second oscillator to be used for determining the temperature.

At least one of the oscillators may comprise a micro-electromechanical (MEM) system. At least one of the oscillators may comprise a resonator circuit. Other oscillators are possible as well.

According to embodiments, a method for calibrating an oscillator is provided, the method comprising measuring the frequencies of a first oscillator and a second oscillator at multiple known temperatures and, using the measured values, determining a temperature characteristic for the first oscillator which describes the dependency of the first oscillator's frequency on the temperature. Further, the method may comprise determining a temperature characteristic for the second oscillator which describes the dependency of the second oscillator's frequency on the temperature, using the measured values. Thus, the temperature characteristics of the oscillators can be generated and calibrated. A temperature model to capture the temperature characteristics of the second oscillator when measured by the first oscillator may then be determined from the temperature characteristics of the oscillators. Such a temperature model takes into account the temperature dependency of the first oscillator's frequency when the first oscillator is used as a reference for determining temperature characteristics of the second oscillator. Finally, the temperature model and the temperature characteristic for the first oscillator to compensate the output frequency of the first oscillator may be provided. Thus, from the temperature model and the temperature characteristic for the first oscillator, the temperature of the oscillators can be determined by measuring a value indicative of the frequency of the second oscillator when measured by the first oscillator. An output frequency of the first oscillator can be stabilized according the measured temperature and the first oscillator's temperature-dependent frequency characteristic.

According to embodiments, the method may further comprise providing a correction model describing a compensation amount for the frequency of the first oscillator depending on the temperature. The correction model may be determined using the temperature characteristic of the first oscillator. Such a correction model allows a fast and efficient determination of a frequency compensation amount at a given temperature.

Therein, the temperature characteristic may comprise a third order polynomial, wherein the second and third order coefficients are assumed to be known, and wherein calibrating the temperature characteristic comprises measuring the frequency of the oscillator at two known temperature values. Thus, only two known temperatures need to be generated in order to calibrate the temperature characteristic. With a suitable choice of second and third order coefficients, higher order effects of the temperature characteristic can be taken into account.

According to embodiments, determining the temperature model may include multiplying the temperature characteristic of the first oscillator with the temperature characteristic of the second oscillator and a scaling factor, thereby deriving a characteristic curve that captures the temperature characteristics of the second oscillator when measured by the first oscillator. The temperature model is useful e.g. to determine the temperature of the first and second oscillator based on the frequency of the second oscillator when measured by the first oscillator.

According to embodiments, a method for stabilizing the output frequency of an oscillator, comprising of the following steps, a first step (a) measuring a value indicative of the frequency of a second oscillator by using a first oscillator, a second step (b) determining a temperature of second oscillator based on the measured value indicative of the frequency of the second oscillator when measured by the first oscillator, a third step (c) capturing the temperature characteristics of the second oscillator when measured by said first oscillator, a fourth step (d) generating a temperature model from the temperature characteristics of the second oscillator, a fifth step (e) compensating the frequency of the first oscillator based on the determined temperature, and a sixth step (f) providing the compensated output frequency of said first oscillator as a stabilized output. According to embodiments, a method for calibrating an oscillator, comprising the following steps, a first step (a) measuring the frequencies of a first oscillator and a second oscillator at multiple known temperatures, a second step (b) using the measured values, determining a temperature characteristic for said first oscillator which describes the dependency of said first oscillator's frequency on the temperature, a third step (c) using the measured values, determining a temperature characteristic for the second oscillator which describes the dependency of said second oscillator's frequency on the temperature, a fourth step (d) determining a temperature model to capture the temperature characteristics of said second oscillator when measured by said first oscillator, and a fifth step (e) providing the temperature model and the temperature characteristic for said first oscillator to compensate the output frequency of said first oscillator.

The determined temperature characteristics of the oscillators, the temperature model and/or the correction model are preferably determined in a calibration phase, e.g. during production of the electronic device which may be a semiconductor chip comprising the oscillators and additional circuitry. The determined temperature characteristics of the oscillators, the temperature model and/or the correction model may be stored on the device/chip, e.g. in persistent memory, and used later during operation of the device/chip to correct the frequency of the first oscillator.

The present application further provides a computer program product comprising instructions, which, when loaded into a processor of a suitable computing device, cause the computing device to perform the above-described method.

According to embodiments, a computer program product comprising instructions, which, when loaded into a processor of a suitable computing device, cause the computing device to perform a method for stabilizing the output frequency of an oscillator, comprising measuring a value indicative of the frequency of a second oscillator by using a first oscillator, determine a temperature of said second oscillator based on the measured value indicative of the frequency of said second oscillator when measured by said first oscillator, and a temperature model to capture the temperature characteristics of said second oscillator when measured by said first oscillator, compensating the frequency of said first oscillator based on the determined temperature, and providing the compensated output frequency of said first oscillator as a stabilized output.

The present application further provides a device for providing a stabilizing output frequency of an oscillator, comprising a first and a second oscillator; a memory for storing a temperature model to capture the temperature characteristics of the second oscillator when measured by the first oscillator; a processor; and compensation circuitry for providing the compensated output frequency of the first oscillator as a stabilized output. Typically, the first oscillator has the same or at least a similar temperature as the second oscillator. The compensation circuitry may comprise a divider or scaler to apply a compensation factor to the frequency of the first oscillator to generate the stabilized output. Alternatively, or in addition, the compensation circuitry may comprise an adder or subtractor to apply an offset to the frequency of the first oscillator. Other forms of compensation are possible as well and may be included in the compensation circuitry.

According to embodiments, a device configured to provide a stabilized output frequency of an oscillator, comprising a first and a second oscillator, a memory for storing a temperature model to capture the temperature characteristics of the second oscillator when measured by the first oscillator, a processor, wherein the processor is adapted to measure a value indicative of the frequency of the second oscillator by using the first oscillator determine a temperature of the second oscillator based on the measured value indicative of the frequency of the second oscillator and the temperature model, determining a compensation amount for the frequency of the first oscillator from the determined temperature, and compensation circuitry for providing a compensated output frequency of the first oscillator as a stabilized output.

The device may be an integrated circuit, a semiconductor chip or an electronic circuitry on a printed circuit board. Furthermore, the device may be included in other electronic devices or semiconductor components, e.g. to provide a stable, i.e. temperature independent, frequency or clock. In principle, such device is useful for any application that requires accurate timing and/or a real-time clock (RTC). This would include, for example, mobile phones, smartphones, tablets, laptops, desktops, etc.

The processor may be adapted to: measure a value indicative of the frequency of the second oscillator by using the first oscillator; determine a temperature of the second oscillator based on the measured value indicative of the frequency of the second oscillator and the temperature model; and determining a compensation amount for the frequency of the first oscillator from the determined temperature.

According to embodiments, the device may further comprise a first and a second counter for counting the respective number of oscillations in the output of the first and the second oscillator; and a control circuit setting a flag when the faster oscillator reaches a predetermined target value of oscillations.

The respective one of the first and the second counter which is connected to the slower oscillator may be adapted to count the oscillations of the slower oscillator until it also reaches the target value of oscillations. The processor may be adapted to measure a value indicative of the frequency of the second oscillator by using the first oscillator by determining the difference in the number of counts between the setting of the flag and the slower oscillator reaching the target value.

In embodiments, the device further comprises a first and a second programmable divider to divide the output frequencies of the first and second oscillator, respectively. In addition, a combination unit for combining the divided first and second frequencies by adding or subtracting signals representing the divided oscillator frequencies may be provided. The device may further include a feedback loop for controlling one of the programmable dividers based on the output frequency. The feedback loop may include a look up table to map the output frequency to an appropriate division value determined by a temperature model that reflects the temperature characteristics of the frequency of an oscillator when measured by another temperature dependent oscillator. The output frequency may be used as an index in the lookup table to retrieve the corresponding division value which can then be input into a register of the programmable divider. This feedback flattens the temperature characteristics of the output frequency.

According to an embodiment, a device for providing a stabilized output frequency of an oscillator is provided. The device comprises: a first and a second oscillator; a first and a second programmable divider to divide the output frequencies of the first and second oscillator, respectively; a combination unit for combining the divided first and second frequencies as the stabilized output frequency; and a feedback loop including a look up table for controlling one of the programmable dividers based on the stabilized output frequency.

The combination unit may add or subtract the signals received from the programmable dividers and generate the stabilized output frequency signal. Registers of the programmable dividers may be set so as to generate a desired target output frequency. The division value of one of the programmable dividers, represented in the programmable register of the divider, may be controlled by the feedback loop to flatten the temperature characteristics of the output frequency.

The present description is mainly explained via embodiments of a method. However, it is to be understood, that any features described in terms of method steps may also be implemented as device features and vice versa.

BRIEF DESCRIPTION OF THE DRAWINGS

The invention is explained below in an exemplary manner with reference to the accompanying drawings, wherein.

DESCRIPTION

According to an embodiment of the present invention, multiple oscillators are provided on a device, wherein the respective oscillator frequencies are dependent on the temperature. If a change in temperature from a first temperature value to a second temperature value occurs, the oscillation frequencies of the multiple oscillators will change according to each oscillator's temperature characteristic. Thus, in principle, from a measurement of the oscillator's temperature-dependent frequency, a temperature value can be determined. This temperature value may then be used to stabilize one oscillator's frequency by determining a compensation amount according to the oscillator's known temperature characteristic. Thus, a stable oscillator output is provided even if the temperature of the oscillator changes.

This concept is illustrated in the present embodiments using MEMs with temperature-dependent oscillation frequencies. However, the concept may also be applied to other electronic components, and, instead of temperature characteristics, the change of output frequencies with respect to changes in the supply voltage, pressure, light or gas density may be determined and compensated.

With the present method and device, temperature measurements on ICs, system in packages and multi-chip modules, etc., can be performed. No time-consuming calibration procedure is required, and high accuracies at high and low temperatures can be achieved. The transient thermal response of the oscillators will generally match the transient response of the chip area, component or other temperature sensitive element such as a resonator circuit, such that reported temperatures closely match the actual temperatures. Thus, real-time temperature information can be provided for improved circuit operation, e.g. if a temperature measurement is used as part of a feedback circuit.

Figure 1:
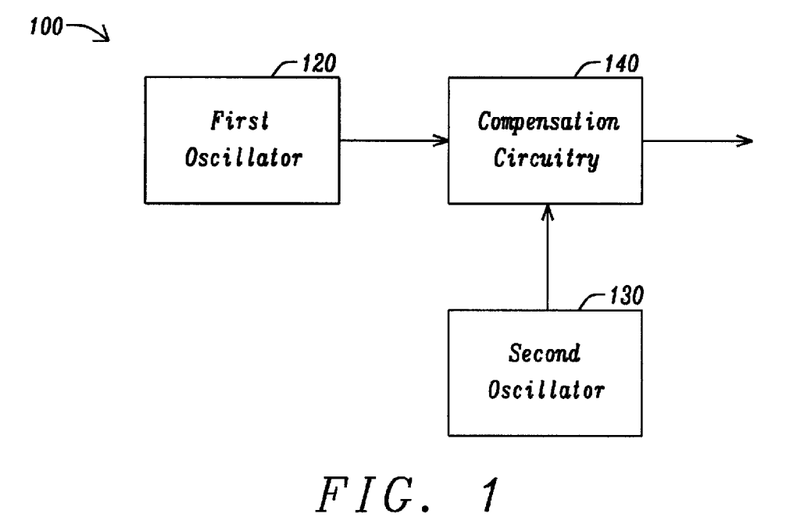
FIG. 1 shows a schematic overview of a device according to an embodiment.

As shown in FIG. 1, device 100 according to an embodiment comprises a first and a second oscillator, e.g. a first MEMs 120 and a second MEMs 130. In general, multiple oscillators with different frequency characteristics may be employed, at least one of which varies with respect to temperature, supply voltage, pressure, light, or gas density, etc. A compensation circuitry 140 is provided in order to determine a compensation amount and in order to generate a stabilized frequency output, wherein the variation of the oscillator frequency due to temperature, supply voltage, pressure, light, or gas density, etc has been compensated.

In the compensation circuitry 140, a correction model generated for the temperature characteristic of the first oscillator 120 can be used, which correction model may e.g. comprise a look-up table of respective compensation amounts for a list of temperature values. Thus, if the temperature of the first oscillator is known, the compensation circuitry 140 can determine what adjustments have to be made to the output of the first oscillator 120 at each temperature in order to stabilize the final output signal.

Figure 2:
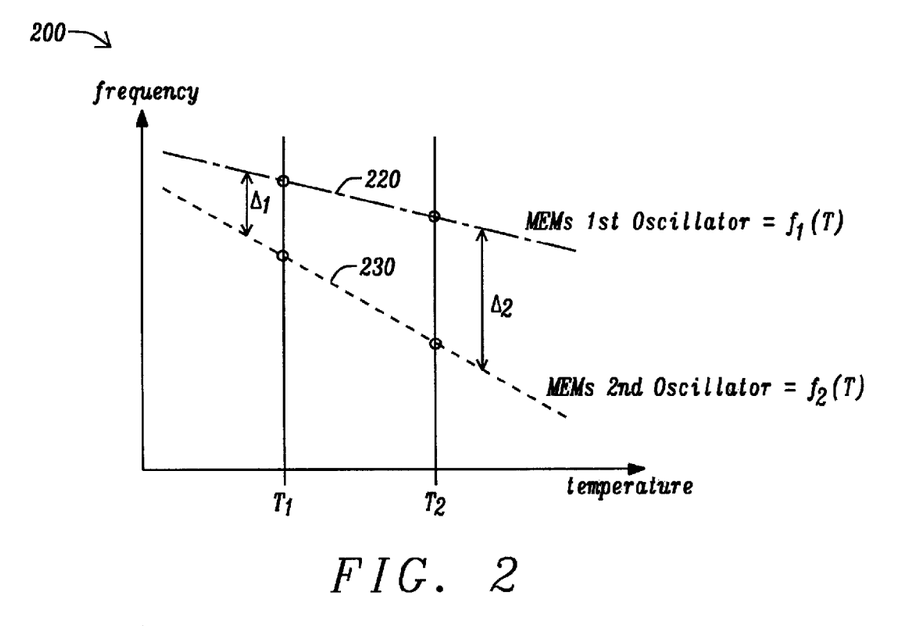
FIG. 2 illustrates the calibration procedure for the first and second oscillators shown in FIG. 1.

As shown in FIG. 2, plot of frequency vs. temperature 200, as the temperature increases, the nominal resonator frequency generally decreases as observed in curve 220 and curve 230, and hence the compensation circuitry 140 of FIG. 1 has to increase the output by a known amount to generate a constant output frequency across all temperatures.

According to an embodiment, a temperature-stable oscillator is provided utilizing two MEMs resonators 120 and 130 of FIG. 1 with known temperature characteristics. In the following discussion, it is assumed that the first MEMs resonator 120 is being used as the resonator generating the final output frequency. However, this is an arbitrary decision, and it is also possible to generate the final, stabilized output frequency using the signal provided by the second MEMs resonator 130.

In each case, the first MEMs resonator 120 and second MEMs resonator 130 of FIG. 1 are being used in combination as a temperature sensor which will be used to provide input to the compensation circuitry 140 of FIG. 1. In theory, the temperature characteristic of the second MEMs resonator 130 could be used on its own to determine the temperature at any given time by measuring the resonator's frequency. This would be simple if its frequency could be accurately determined at all times, for example with a known stable frequency reference. However, by definition no such element exists on the device else there would be no need for these temperature-compensated resonators in the first place. Thus, the output signals of the MEMs resonators 120 and 130 of FIG. 1 are combined in order to determine a temperature value. This could be done in different ways, including, but not limited to, the methods outlined below.

In the example shown in FIG. 2, the temperature characteristics of the frequency plot 200 of the MEMs resonators 120 and 130 are modelled as third-order polynomials as follows:

$$f_1(T) = a_1 + b_1 T + c_1 T^2 + d_1 T^3$$

$$f_2(T) = a_2 + b_2 T + c_2 T^2 + d_2 T^3$$

As indicated in FIG. 2, a calibration procedure is first performed to model these temperature characteristics for the first oscillator MEMs=f2(T) 220 and for second oscillator MEMs−f2(T) 230. Therein, the frequency for each of the oscillators 120,130 is measured at two different known temperature values, $T_1$ and $T_2$. In the present example, it is assumed that the second and third order coefficients $c_1$, $c_2$, $d_1$ and $d_2$ are known, so that, for each temperature characteristic $f_1(T)$, $f_2(T)$, two measured values of f(T) are sufficient in order to determine the zero and first order coefficients a and b. Hence, the respective temperature characteristic $f_1(T)$, $f_2(T)$ of each oscillator 120,130 of FIG. 1 can be determined by measuring the respective frequency at two different, known temperature values $T_1$, $T_2$, as indicated by the circles in FIG. 2.

The first stage in the calibration process is to measure the frequencies of both resonators at a known temperature, $T_1$ (typically, the temperature can be set accurate to ±3° C. on a production tester, which is sufficient here). These frequencies can be measured, for example, by counting the number of pulses from a known and stable reference frequency (e.g. from a crystal) in the time period of each resonator. The next step is to measure the two frequencies again at a second known temperature, $T_2$. This second temperature point could, for example, be generated by applying a known temperature delta (accurate to ±3° C.) with an on-chip heater, or by changing the external environmental temperature to a known value. These four data points can then be used to construct a model for each device's frequency profile with respect to temperature.

Note that depending on the operating temperature range, and the degree of accuracy required for the final outputs, fewer or higher numbers of calibration points may also be used to create this model. In this case, since the MEMs resonators used have very small and highly repeatable higher order coefficients, they can be readily incorporated into the model without the need for further calibration measurements. In the present example, $2^{nd}$ order=−2.4e-8±0.3e-8° $C.^{-1}$; $3^{rd}$ order=5.4e-11±2.8e-11° $C.^{-2}$. If higher-order coefficients are to be determined during the calibration process, and are not considered to be known for a particular oscillator, the calibration process could be extended to n calibration points for determining all coefficients of an $(n-1)^{th}$ order polynomial equation.

Note that, for the present example, it is assumed that $b_1$ and $b_2$ are not equal (e.g. $b_1 \neq b_2$), due to reasons including, but not limited to: manufacturing tolerances in MEMs fabrication, assembly tolerances, different doping of MEMs devices, different sizing of MEMs devices, manufacturing tolerances in the MEMs driving circuitry or different design of the driving circuitry for each device. In the present example, it is assumed that, for any two oscillators 120, 130, the temperature characteristic of the first oscillator is going to differ from the temperature characteristic of the second oscillator.

Figure 3:
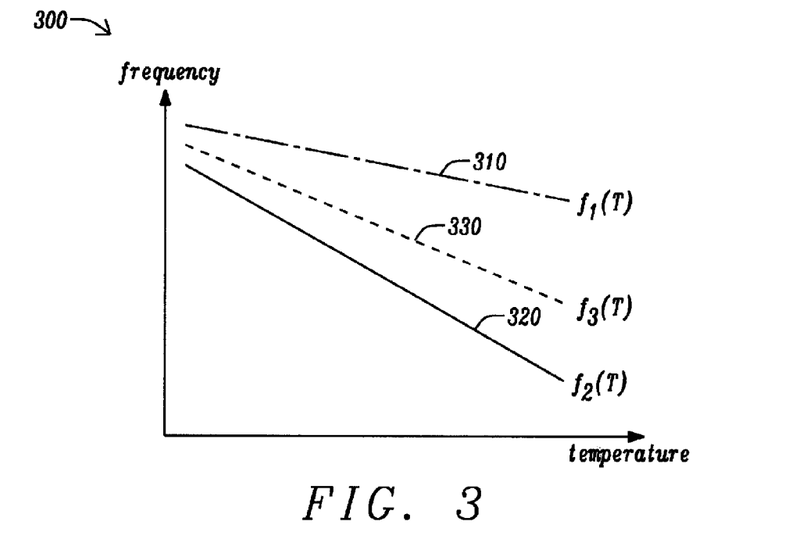
FIG. 3 illustrates a first embodiment of determining a frequency difference between the frequency of the first and the second oscillator.

Once the respective temperature characteristics $f_1(T), f_2(T)$ have been determined for the first oscillator 120 and the second oscillator 130, the device 100 of FIG. 1 can be used in an active mode for providing a stabilized frequency output. FIG. 3. contains plot 300 highlights temperature characteristics $f_1(T)$ 310 and, $f_2(T)$ 320.

According to a first embodiment, during operation of the device 100 of FIG. 1, the frequency of the second oscillator 130 can be measured as before, but using the first oscillator 120 as a reference. As an example for performing such a measurement, the frequency of the reference oscillator 120 may be divided down by a factor. As an example, a factor of $2^{19}$ (=524,288) may be used which generates approximately a 1 Hz signal for an, oscillator with a nominal frequency of 524,288 Hz. The system may then count how many pulses of the second oscillator signal there are in one period of the reduced-frequency reference signal.

The reference signal provided by the first oscillator will change with temperature, but as the temperature characteristic $f_1(T)$ of the first oscillator 120 is known, the temperature dependence of the reference signal can be taken into account when measuring the frequency of the second oscillator 130.

As shown in FIG. 3, a temperature model $f_3(T)$ 330 can be determined, wherein $f_3(T)$ predicts the measured frequency of the second oscillator 130 with respect to temperature, as measured by the first oscillator 120. This measured frequency is not the actual frequency of the second oscillator 130, but it is skewed compared to the actual frequency according to the temperature characteristic $f_1(T)$ 310 of the first oscillator. The measured frequency can nevertheless be used to determine a unique temperature value from the temperature model $f_3(T)$. The determined temperature can be used by the compensation circuitry 140 of FIG. 1 in order to determine the necessary compensation amount according to the temperature characteristic $f_1(T)$ 310.

The compensated signal of the first oscillator 120 can then be provided as a stabilized frequency output by the compensation circuitry 140. Therein, a programmable divider, which may be built using a look up table and accumulator, may be used to modify the frequency of the first oscillator by the required amount in order to generate the stabilized frequency output.

In the present example, $f_3(T)$ 330 corresponds to $k*f_1(T)*f_2(T)$, wherein k is a scaling factor, and can thus be determined at the calibration procedure in order to facilitate the processing in the active mode for providing a stabilized frequency output. A further look-up table may be generated during the calibration procedure which provides temperature values for a list of measured frequencies of the second oscillator 130, as measured by the first oscillator 120 of FIG. 1

According to a second embodiment, it is not necessary to determine an actual frequency value for either of the oscillators 2, 3. Instead, it is sufficient to determine a frequency difference Δ (see FIG. 2), because with the assumption that $b_1 \neq b_2$ and $c_{1/2}, d_{1/2}$ being small, the temperature value can be determined from frequency difference Δ even without knowing any actual frequency value.

From FIG. 2, it can be seen that the differences $\Delta_1, \Delta_2$ between the frequencies of the oscillators increase with increasing temperature. This effect is due to the different slopes $b_1, b_2$ of the temperature characteristics $f_1(T), f_2(T)$. If $b_1 = b_2$, then the differences $\Delta_1, \Delta_2$ between the frequencies of the oscillators would be constant over the whole temperature range. Hence, as stated above, the present example assumes that $b_1 \neq b_2$. Thus, as will be explained in greater detail below, by measuring the frequency differences Δ between two points, it is possible to exactly determine the magnitude of the variable the device is sensitive to. This can then be used for further functions, such as performing temperature compensation, recording a pressure measurement, etc.

Figure 4:
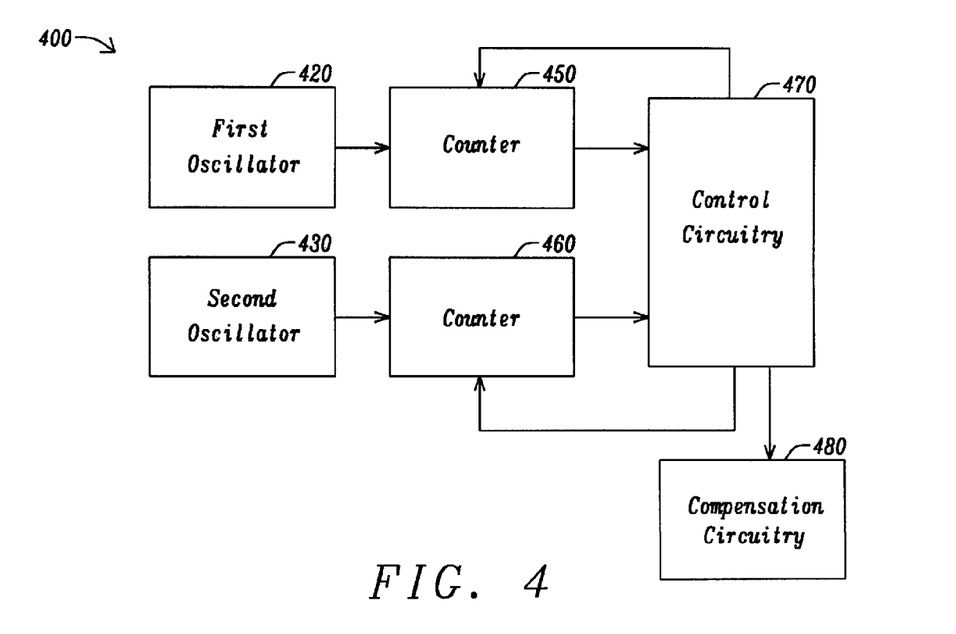
FIG. 4 shows a schematic overview of a device for determining a frequency difference between the frequency of the first and the second oscillator according to a second embodiment.

According to a third embodiment, the device 400 can measure the a value indicative of the frequency difference Δ using counters 450, 460 and a control circuit 470, as shown in FIG. 4. Therein, each oscillator 420, 430 may be fed into a separate counter 450, 460, wherein each counter 450, 460 counts to a set value (for example, 4096). The control circuit 470 is electrically coupled to the compensation circuitry 480.

When the faster oscillator hits this target it can set a flag, and then a control circuit 470 can measure the time or the number of pulses until the slower oscillator also hits the target. The number of additional counts of the slower oscillator is related to the frequency difference between the oscillators.

The number of additional counts made could also be measured at calibration time, instead of or in addition to measuring actual frequency values at the known calibration temperatures $T_1, T_2$. A suitably constructed model can then uniquely identify the temperature from the number of additional counts recorded for the slower oscillator in the active mode of the device 1. Such a model could be a $3^{rd}$ order polynomial model which is constructed in a similar way as described above in conjunction with FIG. 2, and which could uniquely identify the temperature from a measured number of additional counts of the slower oscillator.

According to further embodiments, the calibration scheme and the operation of the device 400 in active mode can also be implemented in other ways, not involving an explicit measurement of the frequency difference. One way to do this would be to first apply correction coefficients separately to both oscillators 420, 430 based on the results of the calibration procedure. The two outputs can then be combined, e.g. by addition or subtraction. After the initial correction, both characteristics would be fairly flat already, and then following the combination of the two slopes the final output would be very temperature insensitive.

Figure 5:
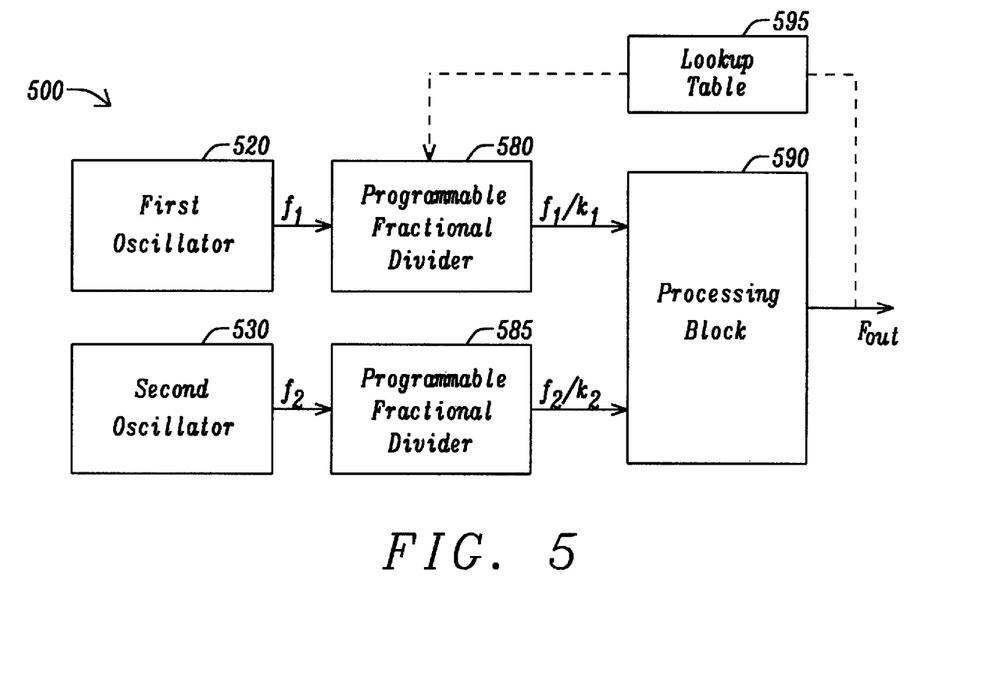
FIG. 5 illustrates a third embodiment.

This correction schema is explained in more detail by referring to FIG. 5. Two oscillators 520, and 530, outputting frequencies f1 and f2, are connected to separate programmable fractional dividers 580, and 590, respectively. The dividers have programmable division values K1, K2 that are set at calibration time based on measured values for each oscillator. The oscillator outputs are then fed into a processing block 595 which combines the two divider outputs into a single pulse stream, for example by addition or subtraction. This correction schema produces an output frequency that has a much flatter frequency characteristic with respect to temperature than either of the oscillators 520, and 530 by themselves. However, the frequency characteristic is not completely flat and further correction can be applied, for example with a feedback loop including a look up table 595, where the index value is calculated as in the first embodiment above. This will then result in a very flat frequency output with respect to temperature.

The feedback loop 597 assists in flattening the frequency dependency of the output frequency Fout by feeding back Fout, or a signal that depends on Fout, to the programmable divider 580, via the lookup table 595. The output frequency, or a signal that is derived therefrom, may be used as an index into the lookup table 595 to access a divider value for programmable divider 580. The lookup table 595 may be populated similar to the temperature model of previous embodiments, by taking into consideration that the frequency of one oscillator is measured by another oscillator, both oscillators having a temperature dependent frequency characteristic. Alternatively, an analytic model may be used for mapping Fout to an appropriate divider value D.

FIG. 5 shows only an example implementation of this principle, and various modifications are apparent. For example, the roles of the first and second oscillator may be exchanged and the feedback loop applied to the second oscillator. Processing block 590 may be implemented in many ways, e.g. via a programmable device such as a programmable controller or by means of logic circuits such as an ASIC of logic circuits integrated together with the oscillators and dividers on an integrated semiconductor circuit.

During calibration, the characteristics of each oscillator are determined by measuring $f1$ and $f2$ at $T1 \rightarrow f1(T1)$ and $f2(T1)$; and measuring $f1$ and $f2$ at $T2 \rightarrow f1(T2)$ and $f2(T2)$ Let the target output frequency be F. Then the division values for the programmable dividers 580, and 590 can be determined by $K1 = F^*[f2(T1) - f2(T2)] / [f1(T2)^* f2(T1) - f2(T2)^* f1(T1)]$ $K2 = (F - f1(T1)^* K1) / f2(T1)$ The output frequency, Fout, in case of a frequency addition in the processing block 10 will then be:

$Fout = K1^* f1(T) + K2^* f2(T) = F$

The advantage of applying the programmable dividers 580, 590 is that it reduces the frequency correction that has to be done by the look up table 595.

In the above-described embodiments, a third order polynomial has been used as a model for the temperature characteristic of an oscillator's frequency, wherein the second and third order coefficients have been assumed to be fixed. In order to account for higher order effects, a higher-order polynomial could be used as a temperature characteristic model. Therein, any higher order coefficients can either be regarded as known and fixed, which saves time and processing power during the calibration stage, or higher order coefficients can be determined during the calibration stage by increasing the number of frequency measurements at known temperature values accordingly.

Figure 6:
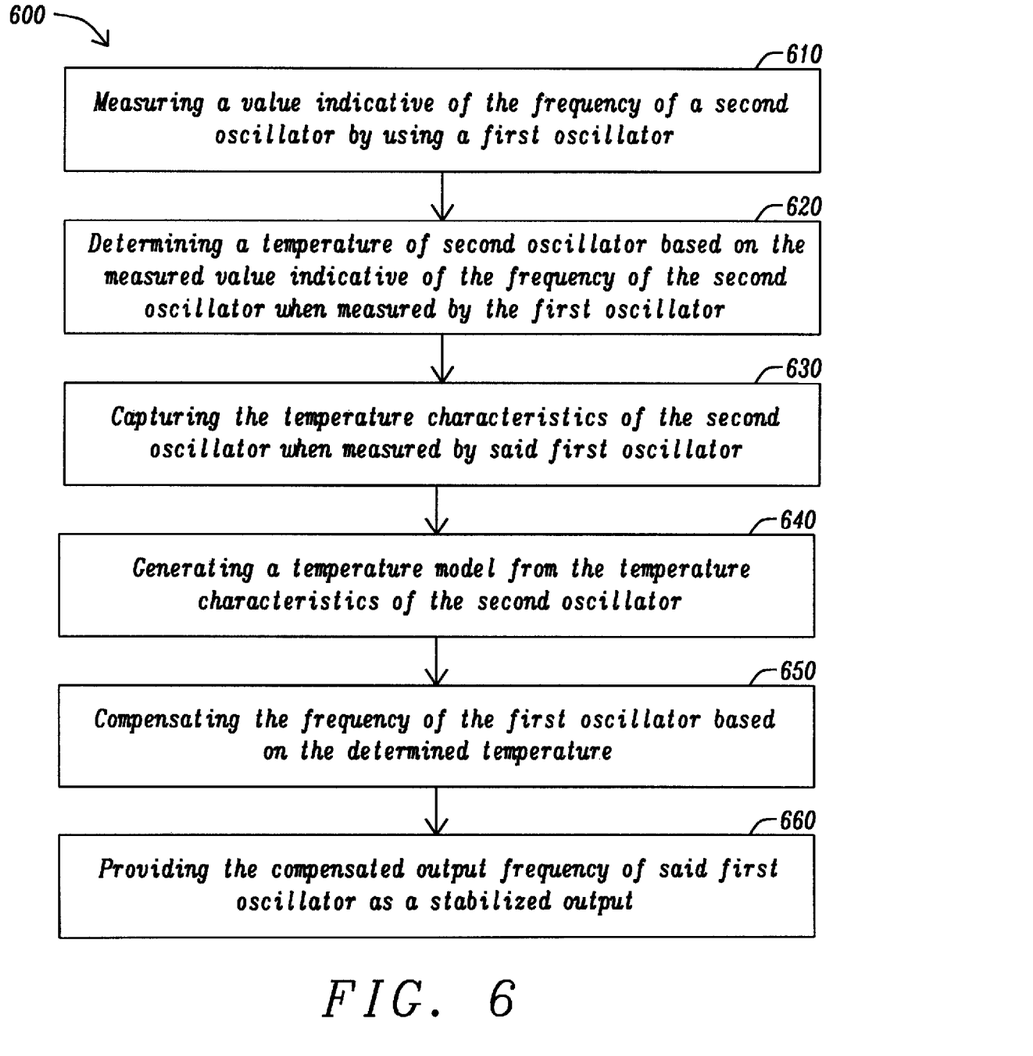
FIG. 6 is a method in accordance with an embodiment of the disclosure.

FIG. 6 is a method of an embodiment in accordance with the disclosure. A method 600 for stabilizing the output frequency of an oscillator, comprising of the following steps: a first step 610 measuring a value indicative of the frequency of a second oscillator by using a first oscillator, a second step 620 determining a temperature of second oscillator based on the measured value indicative of the frequency of the second oscillator when measured by the first oscillator, a third step 630 of capturing the temperature characteristics of the second oscillator when measured by said first oscillator, a fourth step 640 generating a temperature model from the temperature characteristics of the second oscillator, a fifth step 650 compensating the frequency of the first oscillator based on the determined temperature, and a sixth step 660 providing the compensated output frequency of said first oscillator as a stabilized output.

The various embodiments of the present method and device enable the generation of a stabilized output frequency independent of the temperature of the oscillator. Further, the above-described embodiments allow the measurement of a temperature value without the need for a temperature-independent reference signal. Thus, temperature-induced effects in a device can be detected and compensated in real time, even during large or abrupt changes in the device's temperature.

Further, the embodiments of the present method and device enable a temperature measurement in real-time, which provides accurate temperature values at high and low temperatures, as it directly uses the known temperature-dependent behavior of two oscillators and does not rely on any time-consuming and complex calibration that needs to account for higher order effects in a temperature sensor.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Furthermore, it should be noted that steps of various above-described methods and components of described systems can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods. The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

In addition, it should be noted that the functions of the various elements described in the present patent document may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The disclosed circuits and devices may in particular be integrated on a single semiconductor chip using various technologies.

Finally, it should be noted that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. A method for stabilizing the output frequency of an oscillator, comprising:
    measuring a value indicative of the frequency of a second oscillator by using a first oscillator;
    determine a temperature of said second oscillator based on the measured value indicative of the frequency of said second oscillator when measured by said first oscillator, and a temperature model to capture the temperature characteristics of said second oscillator when measured by said first oscillator, wherein the temperature model is based on the temperature characteristics of said first and said second oscillator, wherein the model input corresponds to a frequency measurement of said second oscillator, using said first oscillator as a frequency reference, and the model output corresponds to a temperature of said second oscillator;
    compensating the frequency of said first oscillator based on the determined temperature; and
    providing the compensated output frequency of said first oscillator as a stabilized output.

2. The method of claim 1, further comprising:
    providing a correction model describing the compensation amount for frequencies of said first oscillator depending on its temperature, wherein the correction model captures a temperature characteristic for said first oscillator which describes the dependency of said first oscillator's frequency on the temperature.

3. The method of claim 1, wherein the step of measuring a value indicative of the frequency of said second oscillator by using said first oscillator includes measuring the frequency of the second oscillator, using said first oscillator as a frequency reference; and,
    wherein the temperature of said second oscillator is determined from the measured frequency.

4. The method of claim 3, wherein the step of measuring a value indicative of the frequency of said second oscillator by using said first oscillator, comprises providing a reference signal by scaling the output of said first oscillator and mapping the output of said second oscillator onto the reference signal.

5. The method of claim 1, wherein measuring a value indicative of the frequency of said second oscillator by using said first oscillator comprises measuring a difference between the respective frequencies of said first and said second oscillator; and
    wherein the temperature is determined from the measured difference.

6. The method of claim 1, wherein measuring a value indicative of the frequency of said second oscillator by using said first oscillator comprises:
    counting a respective number of oscillations in the output of said first and said second oscillator;
    setting a flag when the faster oscillator reaches a predetermined target value of oscillations;
    counting the oscillations of the slower oscillator until it also reaches the target value of oscillations; and,
    wherein the temperature is determined from the number of counts between the setting of the flag and the slower oscillator reaching the target value.

7. The method of claim 1, wherein the frequencies of said first and said second oscillator are divided, and the divided frequencies combined to generate the compensated output frequency.

8. The method of claim 1, wherein the temperature characteristic of said first oscillator differs from the temperature characteristic of said second oscillator.

9. The method of claim 1, wherein at least one of the oscillators comprises a micro-electromechanical (MEM) system.

10. The method of claim 1, wherein at least one of the oscillators comprises a resonator circuit.

11. A method for calibrating an oscillator, comprising
    measuring the frequencies of a first oscillator and a second oscillator at multiple known temperatures;
    using the measured values, determining a temperature characteristic for said first oscillator which describes the dependency of said first oscillator's frequency on the temperature;
    using the measured values, determining a temperature characteristic for the second oscillator which describes the dependency of said second oscillator's frequency on the temperature;
    determining a temperature model to capture the temperature characteristics of said second oscillator when measured by said first oscillator, wherein the temperature model is based on the temperature characteristics of said first and said second oscillator, wherein the model input corresponds to a frequency measurement of said second oscillator, using said first oscillator as a frequency reference, and the model output corresponds to a temperature of said second oscillator; and
    providing the temperature model and the temperature characteristic for said first oscillator to compensate the output frequency of said first oscillator.

12. The method of claim 11, further comprising:
    providing a correction model describing a compensation amount for the frequency of the first oscillator depending on the temperature, wherein the correction model is determined using the temperature characteristic of the first oscillator.

13. The method of claim 12, wherein the temperature characteristics comprise a third order polynomial, wherein the second and third order coefficients are assumed to be known, and wherein calibrating the temperature characteristics comprises measuring the frequency of said first oscillator and said second oscillator at two known temperature values.

14. The method of claim 11, wherein determining the temperature model includes multiplying the temperature characteristic of said first oscillator with the temperature characteristic of said second oscillator and a scaling factor.

15. A computer program product on a non-transitory computer readable media comprising instructions, which, when loaded into a processor of a suitable computing device, cause the computing device to perform a method for stabilizing the output frequency of an oscillator, comprising:
    measuring a value indicative of the frequency of a second oscillator by using a first oscillator;
    determine a temperature of said second oscillator based on the measured value indicative of the frequency of said second oscillator when measured by said first oscillator, and a temperature model to capture the temperature characteristics of said second oscillator when measured by said first oscillator, wherein the temperature model is based on the temperature characteristics of said first and said second oscillator, wherein the model input corresponds to a frequency measurement of said second oscillator, using said first oscillator as a frequency reference, and the model output corresponds to a temperature of said second oscillator;
    compensating the frequency of said first oscillator based on the determined temperature; and,
    providing the compensated output frequency of said first oscillator as a stabilized output.

16. A device configured to provide a stabilized output frequency of an oscillator, comprising:
    a first and a second oscillator;
    a memory for storing a temperature model to capture the temperature characteristics of the second oscillator when measured by said first oscillator;
    a processor, wherein the processor is adapted to:
        measure a value indicative of the frequency of said second oscillator by using the first oscillator;
        determine a temperature of said second oscillator based on the measured value indicative of the frequency of said second oscillator and the temperature model, wherein the temperature model is further based on the temperature characteristics of said first and said second oscillator, wherein the model input corresponds to a frequency measurement of said second oscillator, using said first oscillator as a frequency reference, and the model output corresponds to a temperature of said second oscillator;
        determining a compensation amount for the frequency of said first oscillator from the determined temperature; and,
    compensation circuitry for providing a compensated output frequency of said first oscillator as a stabilized output.

17. The device of claim 16, further comprising:
    a first counter and a second counter for counting a respective number of oscillations in the output of said first oscillator and said second oscillator;
    a control circuit setting a flag when the faster oscillator reaches a predetermined target value of oscillations;
    wherein the respective one of said first counter and said second counter which is connected to the slower oscillator is adapted to count the oscillations of the slower oscillator until it also reaches the target value of oscillations; and
    wherein the processor is adapted to measure the value indicative of the frequency of said second oscillator by using said first oscillator by determining the difference in the number of counts of the slower oscillator between the setting of the flag and the slower oscillator reaching the target value.

18. The device of claim 16, further comprising:
    a first and a second programmable divider configured to divide the output frequencies of said first oscillator and said second oscillator, respectively;
    a combination unit for combining the divided first and second frequencies; and,
    a feedback loop for controlling one of the programmable dividers based on the output frequency.

19. The device of claim 16, wherein said device being implemented as an integrated circuit.

* * * * *